(12) United States Patent
Tsunoda (10) Patent No.: US 9,172,360 B2
(45) Date of Patent: Oct. 27, 2015

(54) EMPHASIS SIGNAL GENERATING CIRCUIT AND METHOD FOR GENERATING EMPHASIS SIGNAL

(71) Applicant: FUJITSU LIMITED, Kawasaki-shi, Kanagawa (JP)

(72) Inventor: Yukito Tsunoda, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/539,191

(22) Filed: Nov. 12, 2014

(65) Prior Publication Data

US 2015/0207500 A1 Jul. 23, 2015

(30) Foreign Application Priority Data

Jan. 21, 2014 (JP) .................................. 2014-008477

(51) Int. Cl.
*H03K 5/1252* (2006.01)
*H03K 5/14* (2014.01)

(52) U.S. Cl.
CPC ................ *H03K 5/1252* (2013.01); *H03K 5/14* (2013.01)

(58) Field of Classification Search
CPC ......... H04B 10/50; H03K 5/1252; H03K 5/14
USPC .......... 375/295, 296; 327/108, 100, 551–559, 327/261, 276; 398/192
See application file for complete search history.

(56) References Cited

U.S. PATENT DOCUMENTS

| 7,551,897 | B1 * | 6/2009 | Savoj ............................. 455/43 |
| 8,630,369 | B2 * | 1/2014 | Tsunoda ...................... 375/296 |
| 8,791,652 | B2 * | 7/2014 | Oku et al. .................... 315/297 |
| 2003/0198105 | A1 | 10/2003 | Yamaguchi et al. |
| 2004/0113656 | A1 | 6/2004 | Sato |
| 2009/0179674 | A1 | 7/2009 | Tamura et al. |
| 2011/0221506 | A1 | 9/2011 | Tamura et al. |
| 2013/0314142 | A1 | 11/2013 | Tamura et al. |
| 2014/0140708 | A1 * | 5/2014 | Tsunoda ...................... 398/192 |

FOREIGN PATENT DOCUMENTS

| JP | 2001-217682 | 8/2001 |
| JP | 2002-123332 | 4/2002 |
| JP | 2003-309543 | 10/2003 |
| JP | 2004-88693 | 3/2004 |

* cited by examiner

*Primary Examiner* — Dinh Le
(74) *Attorney, Agent, or Firm* — Staas & Halsey LLP (57) ABSTRACT

An emphasis signal generating circuit includes: a branch and delay unit configured to branch an input signal, delay a branched signal, and output a first delayed signal; a high-frequency extraction unit configured to extract at least one of high-frequency components of the input signal and the first delayed signal to output a high-frequency signal; and an addition and subtraction unit configured to add and subtract the input signal, the first delayed signal, and the high-frequency signal.

13 Claims, 12 Drawing Sheets

EMPHASIS SIGNAL GENERATING CIRCUIT AND METHOD FOR GENERATING EMPHASIS SIGNAL

CROSS-REFERENCE TO RELATED APPLICATION

This application is based upon and claims the benefit of priority of the prior Japanese Patent Application No. 2014-008477, filed on Jan. 21, 2014, the entire contents of which are incorporated herein by reference.

FIELD

The embodiments discussed herein are related to an emphasis signal generating circuit and a method for generating the emphasis signal.

BACKGROUND

Japanese Laid-open Patent Publication No. 2004-088693 discloses a related technique.

SUMMARY

According to an aspect of the embodiments, an emphasis signal generating circuit includes: a branch and delay unit configured to branch an input signal, delay a branched signal, and output a first delayed signal; a high-frequency extraction unit configured to extract at least one of high-frequency components of the input signal and the first delayed signal to output a high-frequency signal; and an addition and subtraction unit configured to add and subtract the input signal, the first delayed signal, and the high-frequency signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the communication field, with increase in amount of data communications, data rate has been increased since a large amount of data is transmitted in a single signal path. In the communication path, electrical signals or optical signals are transmitted. High-speed data may be subjected to degradation such as inter-symbol interference in cables, boards, output devices, or the like. Therefore, pre-emphasis may be performed in which an emphasis signal generating circuit takes an amount of degradation in a signal into consideration, generates an emphasis signal whose portion, which is susceptible to degradation due to inter-symbol interference, is previously strengthened, and outputs the emphasis signal to a transmission path.

In generating the emphasis signal, the finite impulse response (FIR) method, for example, is used in which a delay for an input signal to the exemplary emphasis signal generating circuit is generated by delaying a branched signal which is branched from the input signal, and the input signal and the branched signal are added or subtracted with each other.

The emphasis signal generated by the FIR method may have a low degree of freedom in waveform shaping. In the emphasis signal generated by the FIR method, although an eye opening is improved as compared with a case without using the emphasis signal, frequency dependence of phase characteristics such as group delay may be larger and jitter may increase. To decrease the frequency dependence and the jitter, the number of branches (the number of taps) may be increased, for example. The increase in taps, however, may increase in circuit scale and power consumption.

Figure 1:
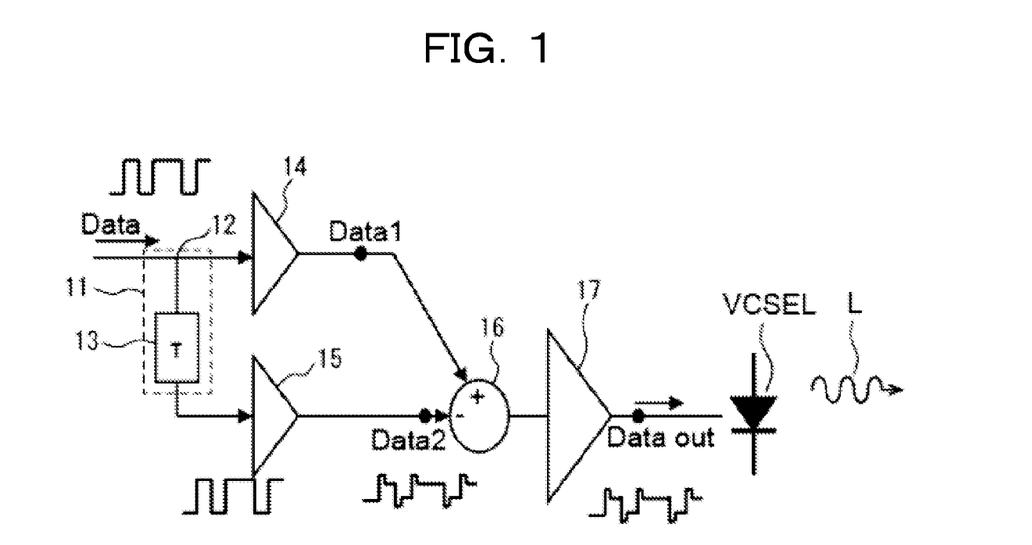
FIG. 1 illustrates an example of an emphasis signal generating circuit.

FIG. 1 illustrates an example of an emphasis signal generating circuit. An emphasis signal generated by the emphasis signal generating circuit illustrated in FIG. 1 drives a light-emitting device (vertical cavity surface emitting laser: VCSEL).

The emphasis signal generating circuit includes a branch and delay unit 11, a first amplifier 14, a second amplifier 15, an addition and subtraction unit 16, and an output amplifier 17. The branch and delay unit 11 includes a branch unit 12 that branches an input data signal Data and generates a main data signal Data 1 and a branched data signal Data 2, and a delay unit (T) 13 that delays the branched data signal Data 2. The first amplifier 14 amplifies the main data signal Data 1 with a first gain a. The second amplifier 15 amplifies the branched data signal Data 2 with a second gain b. The addition and subtraction unit 16 subtracts the amplified branched data signal Data 2 from the amplified main data signal Data 1 to generate an emphasis signal Data out. The output amplifier 17 amplifies the emphasis signal output from the addition and subtraction unit 16 and outputs the resultant signal. The VCSEL is modulated with the amplified emphasis signal Data out, and outputs an optical signal L corresponding to the emphasis signal. The emphasis signal generating circuit may not only be used in driving the VCSEL illustrated in FIG. 1 but widely used.

Figure 2A:
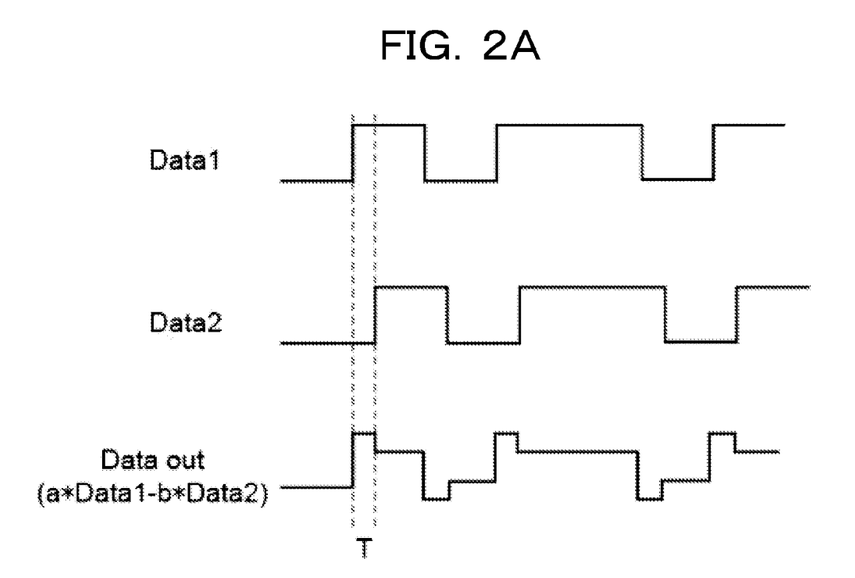
FIGS. 2A and 2B illustrate an example of frequency components (characteristics) in transmission paths.
Figure 2B:
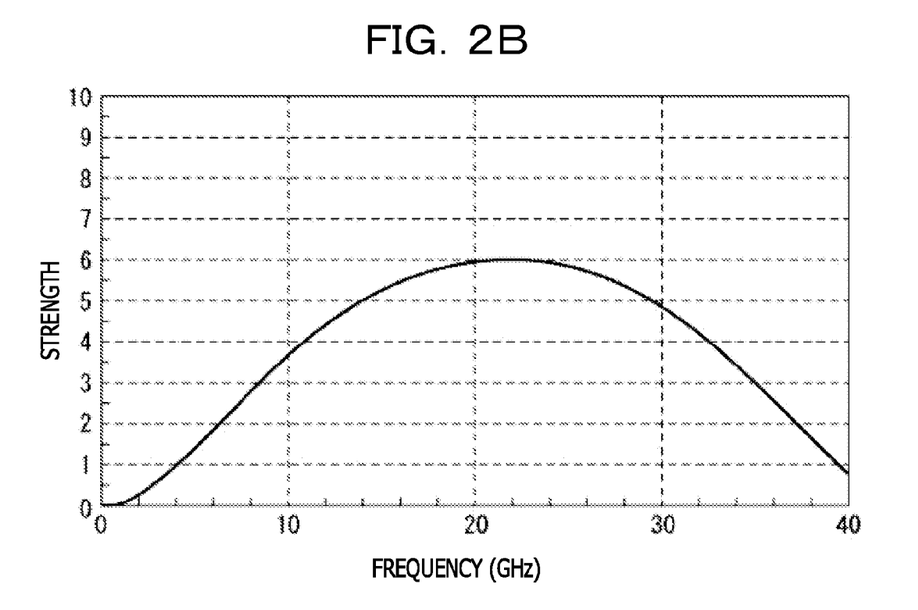

FIGS. 2A and 2B illustrate an example of frequency components (characteristics) in transmission paths. In FIGS. 2A and 2B, frequency components (characteristics) in transmission paths are illustrated when pre-emphasis is performed with the main data signal Data 1 and the branched data signal Data 2 which are used for generation of an emphasis signal, and the emphasis signal Data out. As illustrated in FIG. 2A, the main data signal Data 1 is a pulse signal and the branched data signal Data 2 is a signal in which the main data signal Data 1 is delayed by time T. The main data signal Data 1 and the branched data signal Data 2 are amplified by the first gain a and the second gain b that is smaller than the first gain a, respectively. The branched data signal Data 2 is therefore a signal with a smaller amplitude than that of the main data signal Data 1. In this state, the branched data signal Data 2 is subtracted from the main data signal Data 1 to obtain the emphasis signal Data out (a*Data 1−b*Data 2) as illustrated. Although the data signals may have degraded waveform, the rectangular pulse signals are illustrated in FIG. 2A for simple explanation. Descriptions below may similarly be given.

Rise and fall is emphasized by subtracting the branched data signal Data 2 from the main data signal Data 1 and, therefore, the emphasis signal that compensates for signal degradation is obtained. The time T, the first gain a, and the second gain b may appropriately be set according to a desired pre-emphasis effect. When a=1 and b=0 are set, a signal with which pre-emphasis is not performed is generated.

FIG. 2B illustrates a frequency component (characteristic) in a transmission path when the pre-emphasis is performed with the emphasis signal Data out. In FIG. 2B, the abscissa denotes the frequency and the ordinate denotes a strength. A frequency characteristic in which the frequency of the pulse is a center frequency and a distribution close to a sine wave is developed is illustrated.

Figures 3A, 3B, 3C, 3D:
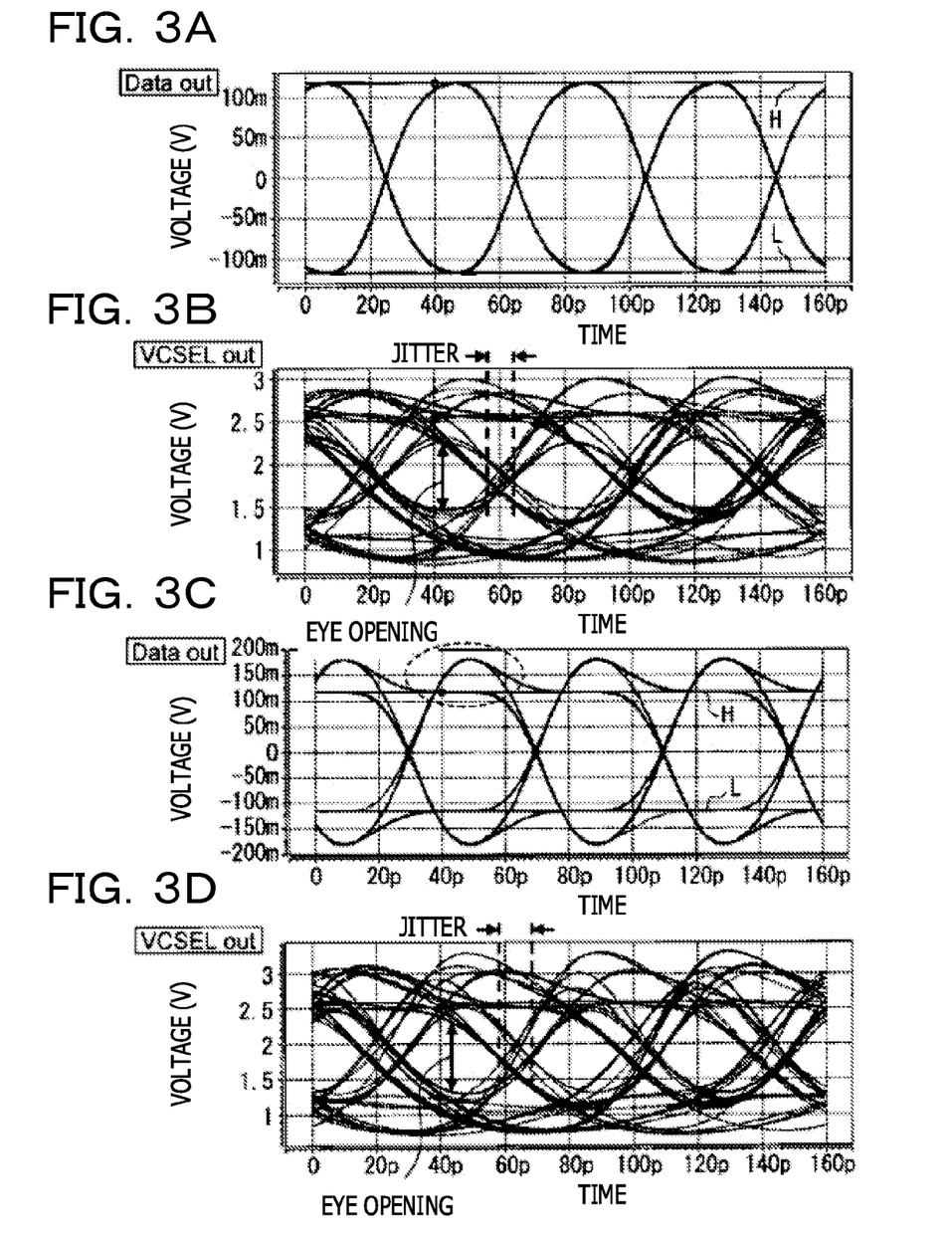
FIGS. 3A to 3D illustrate an example of effects obtained by pre-emphasis.

FIGS. 3A to 3D illustrate an example of effects obtained by pre-emphasis. In FIGS. 3A to 3D, effects obtained by the pre-emphasis using the emphasis signal above are illustrated. FIG. 3A illustrates a Data out without the pre-emphasis. FIG. 3B illustrates an optical signal (VCSEL out) from the VCSEL without the pre-emphasis. FIG. 3C illustrates the Data out with the pre-emphasis. FIG. 3D illustrates the VCSEL out with the pre-emphasis.

As illustrated in FIG. 3A, the Data out without the pre-emphasis is a differential signal composed of a sine wave signal and an inverted signal thereof with H and L being respectively highest and lowest values. Driving of the VCSEL with the Data out as illustrated in FIG. 3A leads to output of the signal VCSEL out having a small eye opening and some degree of jitter as illustrated in FIG. 3B.

As illustrated in FIG. 3C, the Data out with the pre-emphasis results in a signal with a large amplitude beyond H and L. In FIG. 3C, a portion enclosed by the dashed line and depicted as emphasis denotes a portion with higher amplitude as a consequence of the emphasizing effect. Driving of the VCSEL with the Data out as illustrated in FIG. 3C leads to output of the signal VCSEL out having a wider eye opening as illustrated in FIG. 3D. The jitter may increase to some extent as compared with the VCSEL out without the pre-emphasis illustrated in FIG. 3B.

As illustrated in FIGS. 3A to 3D, in a case without the pre-emphasis, the VCSEL out may have an insufficient speed and a degraded waveform. In a case with the pre-emphasis using the emphasis signal, by contrast, the eye opening may be improved but the jitter may increase.

To obtain a better effect of the pre-emphasis, the number of branched data signals branched from an input data signal, for example, the number of taps may be increased to synthesize the emphasis signal more accurately. For example since increase in the number of taps correspondingly increases the number of inputs of the delay unit, the amplifiers, and the addition and subtraction unit, circuit scale and power consumption may increase. The numbers of the branch and delay unit, the amplifiers and the taps that are increased are limited, so that the emphasis signal may be generated with a low degree of freedom and the phase characteristics may not sufficiently be compensated for. As a result, the jitter may not sufficiently be reduced.

The emphasis signal generating circuit may generate an emphasis signal exhibiting a favorable pre-emphasis effect without increasing the number of taps or minimizing the number of taps to be increased.

Figure 4:
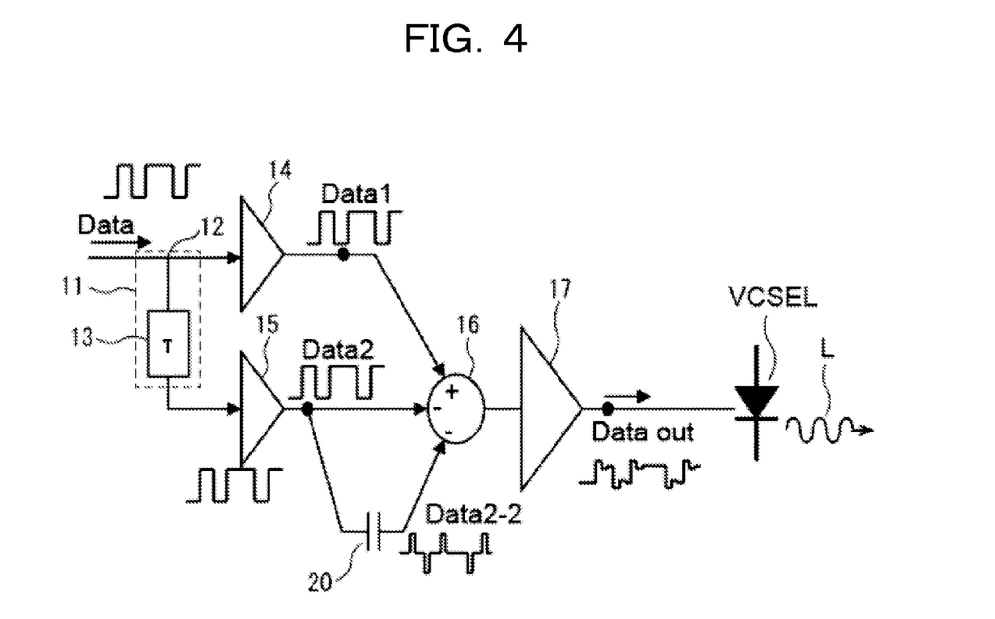
FIG. 4 illustrates an example of an emphasis signal generating circuit.

FIG. 4 illustrates an example of an emphasis signal generating circuit. The emphasis signal generating circuit illustrated in FIG. 4 includes the branch and delay unit 11, the first amplifier 14, the second amplifier 15, the addition and subtraction unit 16, the output amplifier 17, and a coupling capacitor unit (high-frequency extraction unit) 20. The branch and delay unit 11 includes the branch unit 12 that branches an input data signal Data and generates a main data signal Data 1 and a branched data signal Data 2, and the delay unit (T) 13 that delays the branched data signal Data 2. Therefore, the number of taps may be two. The first amplifier 14 amplifies the main data signal Data 1 with a first gain a. The second amplifier 15 amplifies the branched data signal Data 2 with a second gain b. The coupling capacitor unit 20 may include a capacitor, for example. The branched data signal Data 2 amplified by the second amplifier 15 with the second gain b is input to one end of the capacitor, and the capacitor passes high-frequency components. The coupling capacitor unit 20 may act as, for example, a high-pass filter. The addition and subtraction unit 16 subtracts the branched data signal Data 2 which is amplified and the high-frequency component of the branched data signal Data 2 which is amplified from the main data signal Data 1 which is amplified, to generate an emphasis signal Data out. The output amplifier 17 amplifies the emphasis signal output from the addition and subtraction unit 16 and outputs the resultant signal. The VCSEL is modulated directly with the amplified emphasis signal Data out, and outputs an optical signal L corresponding to the emphasis signal.

The emphasis signal may drive the VCSEL, and the emphasis signal generating circuit may generate drive signals for output circuits in respective communication paths.

Figure 5:
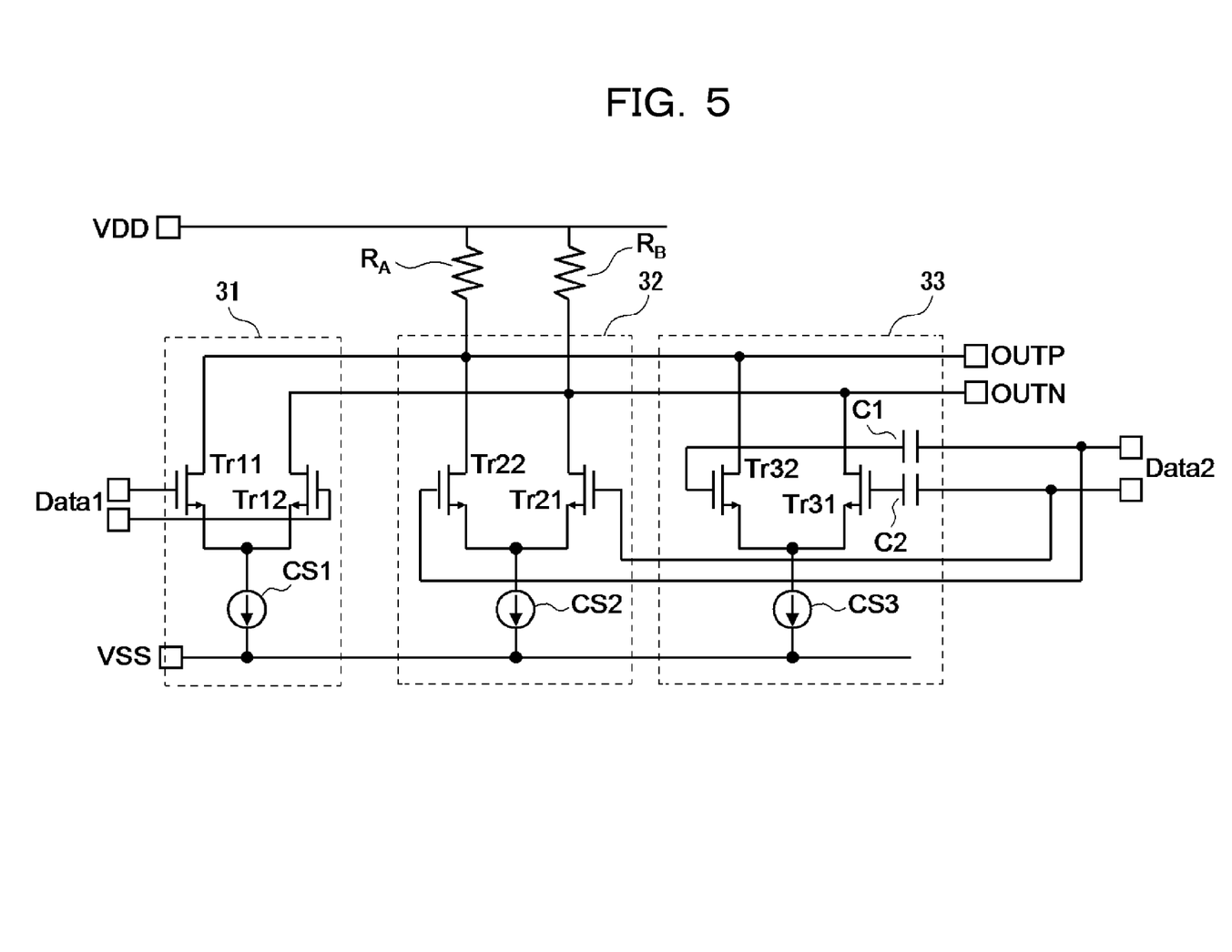
FIG. 5 illustrates an example of an addition and subtraction unit and a coupling capacitor unit.

FIG. 5 illustrates an example of an addition and subtraction unit and a coupling capacitor unit. The addition and subtraction unit 16 is of a differential type and includes a load serially coupled between a high-potential source VDD and a low-potential source VSS and an input part. The input part may include an n-type field-effect transistor, a p-type field-effect transistor, or a bipolar transistor.

The load includes resistors $R_A$ and $R_B$ both having an identical resistance value and coupled to VDD. The input part includes a plurality of (three, here) current circuits 31 to 33 coupled in parallel that produce currents corresponding to an input. The current circuits 31 to 33 include transistor pairs Tr11 and Tr12, Tr21 and Tr22, and Tr31 and Tr32, respectively, each of which is coupled to the load, as well as constant current sources CS1 to CS3 coupled to sources of the transistor pairs, respectively. The coupling of the transistor pairs in the current circuits 31 to 33 to the resistors $R_A$ and $R_B$ depend upon whether addition or subtraction is performed. For example, the main data signal Data 1 to be added is input to the current circuit 31, so that the transistor Tr11 is coupled to the resistor $R_A$ and the transistor Tr12 to the resistor $R_B$; the branched data signal Data 2 to be subtracted is input to the current circuit 32, so that the transistor Tr21 is coupled to the resistor $R_B$ and the transistor Tr22 to the resistor $R_A$; and, similarly to the current circuit 33, the high-frequency component of the branched data signal Data 2 to be subtracted is input, so that the transistor Tr31 is coupled to the resistor $R_B$ and the transistor Tr32 to the resistor $R_A$. Alternatively, the addition and the subtraction are switched by changing the coupling of the pairs of signals input to the transistor pairs.

Gains of signals subjected to the addition and the subtraction may be set by varying a current ratio among the constant current sources CS1 to CS3. For example, a case where CS1: CS2:CS3=0.8:0.1:0.1 in an amount of the current may be substantially identical with a case where the gain a and the gain b are set to 0.8 and 0.1, respectively. In this case, the amplifiers 14 and 15 may be removed or amplifiers having an identical amplification factor may be used.

The current circuit 33 includes capacitors C1 and C2 in addition to the transistor pair Tr31 and Tr32 and the constant current source CS3. The Data 2 is applied to gates of the Tr21 and the Tr22 of the current circuit 32, and the Data 2 is applied to gates of the Tr31 and the Tr32 of the current circuit 33 through the C1 and C2. The capacitance values of the C1 and the C2 may be set in accordance with a high-frequency component to be extracted. The amount of current of the CS3 may be set such that a desired high-frequency component is subtracted. The C1 and the C2 may be provided at an outside the current circuit 33. The circuit has a linearity up to the high-frequency for transmission of high-frequency signals to the addition and subtraction unit 16. When the addition and subtraction unit 16 is arranged apart from the coupling capacitor 20, the linearity is desirably maintained up to the high-frequency through a long path from the coupling capacitor 20 to the addition and subtraction unit 16, so that the coupling capacitor 20 may be arranged in the current circuit 33 as illustrated in FIG. 5. The current circuit 33, the transistor pair Tr31 and Tr32, and the constant current source CS3 illustrated in FIG. 5 perform parallel addition of the high-frequency component, and linearity of the high-frequency component may become higher.

In the current circuit 33, the Data 2 is applied to the gates of the Tr31 and the Tr32 through the C1 and the C2. In this case, direct current levels at the gates of the Tr31 and the Tr32 may be unstabilized. Therefore, resistor division and other processing may be performed to stabilize the direct current levels at the gates of the Tr31 and the Tr32.

Figure 6:
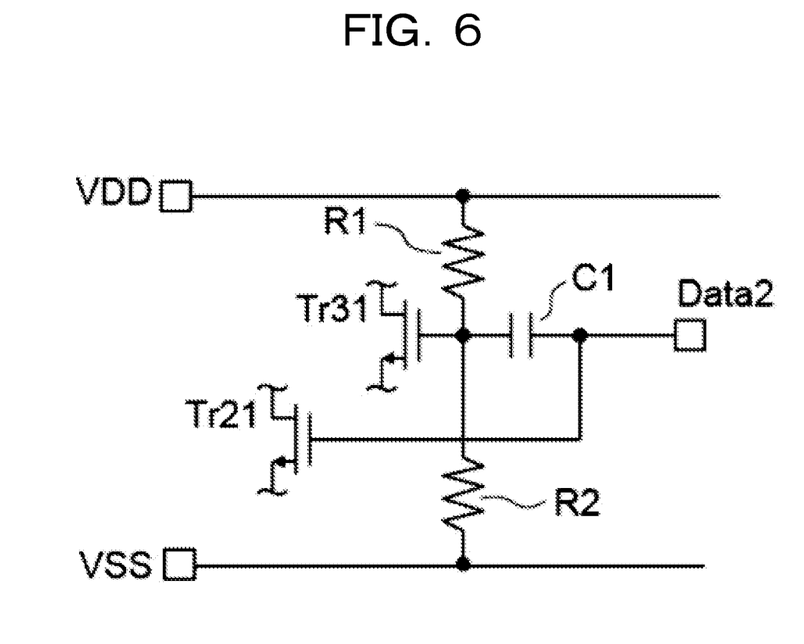
FIG. 6 illustrates an example of a stabilizer circuit.

FIG. 6 illustrates an example of a stabilizer circuit. In FIG. 6, the circuit in which the direct current level at the gate of the Tr31 is stabilized is illustrated. As illustrated in FIG. 6, the resistors R1 and R2 are serially coupled between VDD and VSS. A desired potential at the gate of the Tr31 is obtained at a coupling node of the R1 and the R2 as a result of resistor division. The gate of the Tr31 and one terminal of the C1 are coupled to the coupling node of the R1 and the R2. The branched data signal Data 2 is applied to another terminal of the C1 and the gate of the Tr21. The high-frequency component of the Data 2 that varies about the direct current level obtained by the resistor division of the resistors R1 and R2, is applied to the gate of the Tr31. The direct current level at the gate of the Tr32 may similarly be stabilized.

In the above-mentioned emphasis signal generating circuit, the coupling capacitor unit 20 is coupled to the branched signal that is delayed after branching; and the high-frequency component of the branched signal is separated to be input to the addition and subtraction unit 16. Only the high-frequency component of the branched signal may be separated to be input to the addition and subtraction unit 16. The high-frequency component, for example, only the high-frequency component is separately emphasized, so that strengthening of high-frequency components and/or addition/subtraction of high-frequency components with different amounts of delay is performed. Phase compensation such as group delay compensation for the high-frequency component is individually performed, not only the strength characteristics but also the phase characteristics, for example, the jitter may be improved.

The high-frequency component of the branched signal may be subtracted or added. The coupling capacitor unit 20 extracts the high-frequency component of the branched signal that is delayed after branching. The high-frequency component of the main data signal Data 1 is extracted to be separately added and subtracted by the addition and subtraction unit 16 for emphasis processing. Alternatively, both the high-frequency components of the main data signal Data 1 and the branched signal are extracted to be separately added and subtracted by the addition and subtraction unit 16 for emphasis processing. The phase compensation performed for the high-frequency component, for example, only for the high-frequency component, may provide a higher degree of freedom in generating the emphasis signal. Since the high-frequency component is separated by the coupling capacitor, the reduction in the number of taps as well as the minimization of the circuit scale and the power consumption may be achieved. Also, only the high-frequency component is separated, and then added and subtracted by the addition and subtraction unit 16, so that the signal may not be affected by non-linearity of circuits in the taps.

Figure 7:
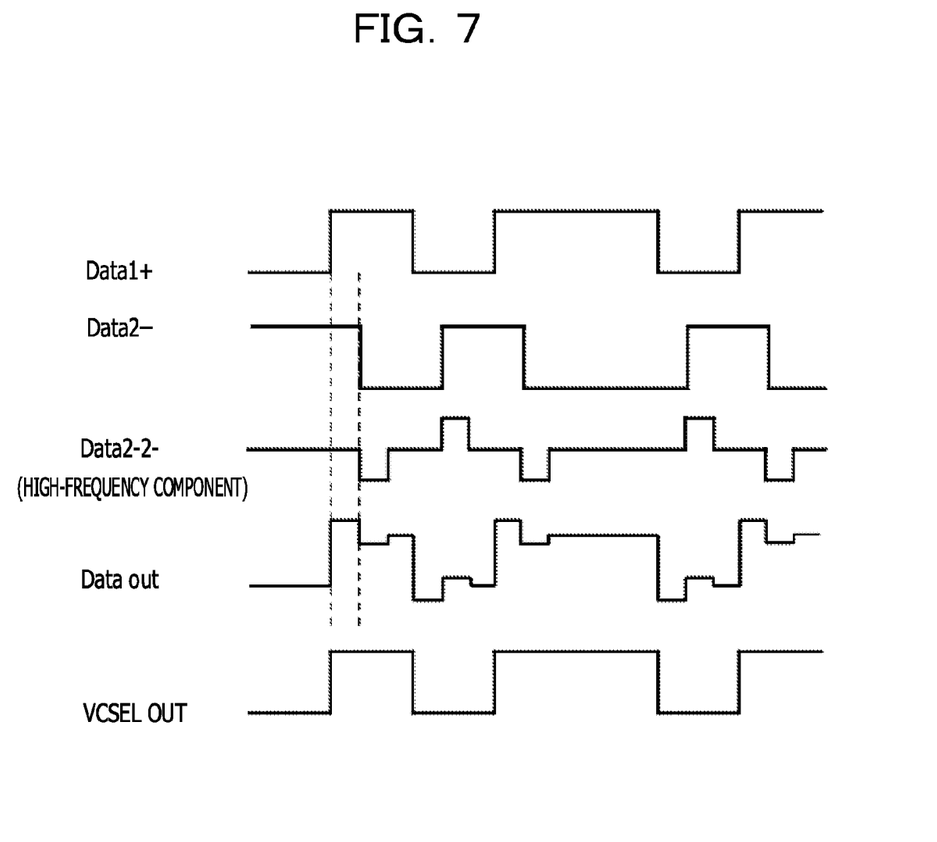
FIG. 7 illustrates an example of signal waveforms subjected to signal synthesis.

FIG. 7 illustrates an example of signal waveforms subjected to signal synthesis. In FIG. 7, the waveforms of the main data signal Data 1, the branched data signal Data 2, the high-frequency component of the Data 2 Data 2-2, the emphasis signal Data out, and the optical output signal VCSEL out that are synthesized by the emphasis signal generating circuit illustrated in FIG. 4, are illustrated. In FIG. 7, "+" is attached for addition while "−" is attached for subtraction, and the waveforms of signals to be subtracted are illustrated in an inverted manner. The Data out denotes a signal in which the Data 1, the Data 2, and the Data 2-2 are synthesized with a certain weight.

Figure 8A:
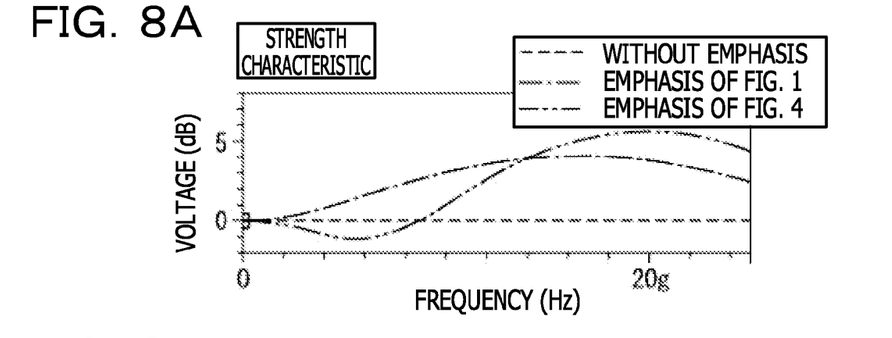
FIGS. 8A to 8D illustrate an example of simulation results.
Figure 8B:
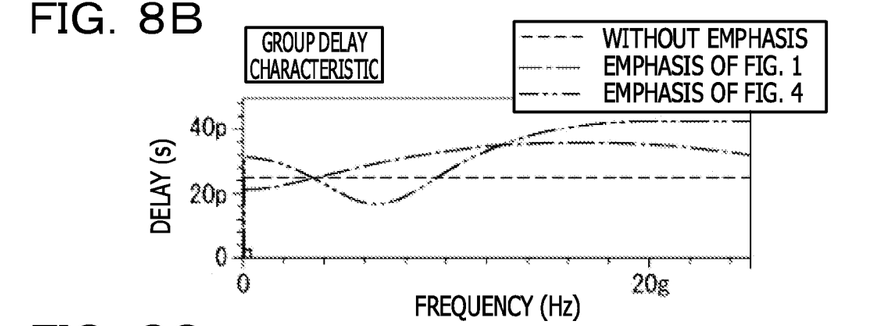
Figure 8C:
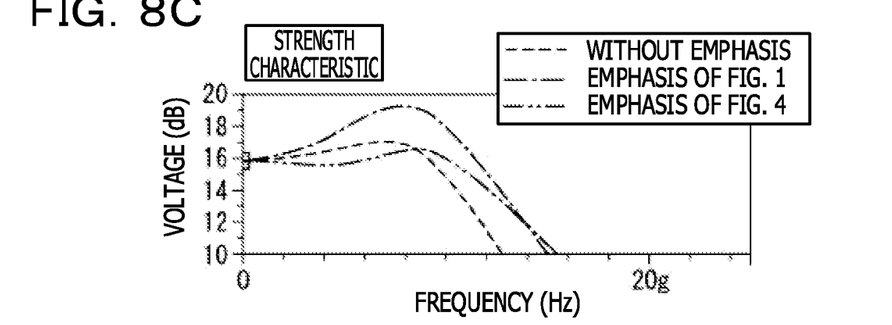
Figure 8D:
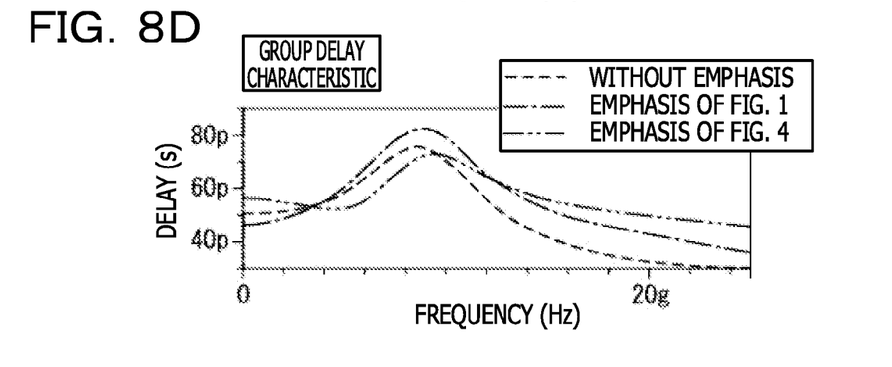

FIGS. 8A to 8D illustrate an example of simulation results. In FIGS. 8A to 8D, simulation results of frequency characteristics of the emphasis signal Data out and the optical output signal VCSEL out that are generated by the emphasis signal generating circuit illustrated in FIG. 4, are illustrated. Abscissas in FIGS. 8A to 8D denote the frequency. The dashed lines illustrate cases without the emphasis. The dot-dash lines illustrate cases of the emphasis signal generating circuit of FIG. 1. The chain double dashed lines illustrate cases of the emphasis signal generating circuit of FIG. 4. FIG. 8A illustrates the strength characteristic of the Data out, and the ordinate denotes the voltage (dB). FIG. 8B illustrates the group delay characteristic of the Data out, and the ordinate denotes the delay (second). FIG. 8C illustrates the strength characteristic of the VCSEL out, and the ordinate denotes the voltage (dB). FIG. 8D illustrates the group delay characteristic of the VCSEL out, and the ordinate denotes the delay (second).

As illustrated in FIG. 8A, in the case of the emphasis signal generating circuit of FIG. 1, the high-frequency component of the emphasis signal is more emphasized than the case without the emphasis. In the case of the emphasis signal generating circuit of FIG. 4, the high-frequency component of the emphasis signal is further emphasized while the low-frequency component is the negative and suppressed.

As illustrated in FIG. 8B, in the case of the emphasis signal generating circuit of FIG. 1, as compared with the case without the emphasis, the delay of the emphasis signal increases as the frequency increases, the delay reaches to maximum at approximately 15 GHz, and then reduces. In the case of the emphasis signal generating circuit of FIG. 4, the delay of the emphasis signal ranging from 3 to 8 GHz reduces once, increases at higher frequencies, and at 15 GHz or more, the delay goes beyond the case of the emphasis signal generating circuit of FIG. 1.

As illustrated in FIG. 8C, in the case of the emphasis signal generating circuit of FIG. 1, the strength of the VCSEL out is higher as a whole as compared with the case without the emphasis. In the case of the emphasis signal generating circuit of FIG. 4, the strength of the VCSEL out appears similarly to the case without the emphasis; however, the strength is maintained to higher frequencies.

As illustrated in FIG. 8D, in the case of the emphasis signal generating circuit of FIG. 1, the delay of the VCSEL out increases, as compared with the case without the emphasis. The delay reaches to maximum at approximately 9 GHz, and then reduces. By contrast, in the case of the emphasis signal generating circuit of FIG. 4, the delay of the VCSEL out appears with a small variation as a whole.

Figure 9A:
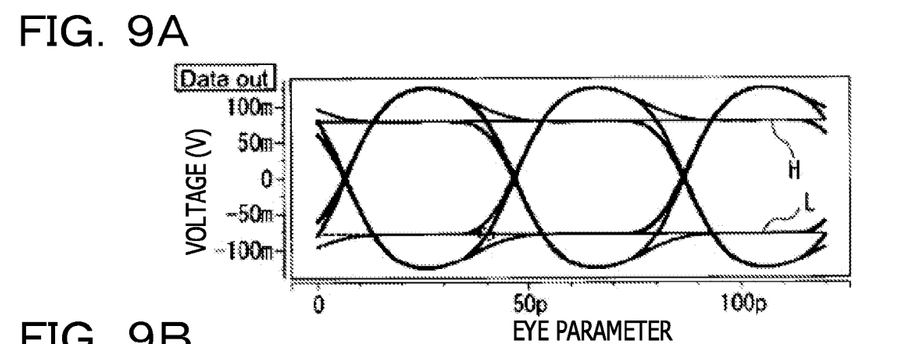
FIGS. 9A to 9D illustrate an example of effects obtained by pre-emphasis.
Figure 9B:
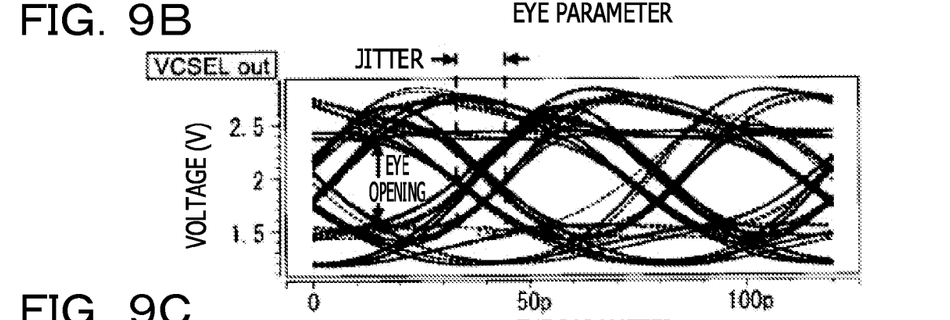
Figures 9C, 9D:
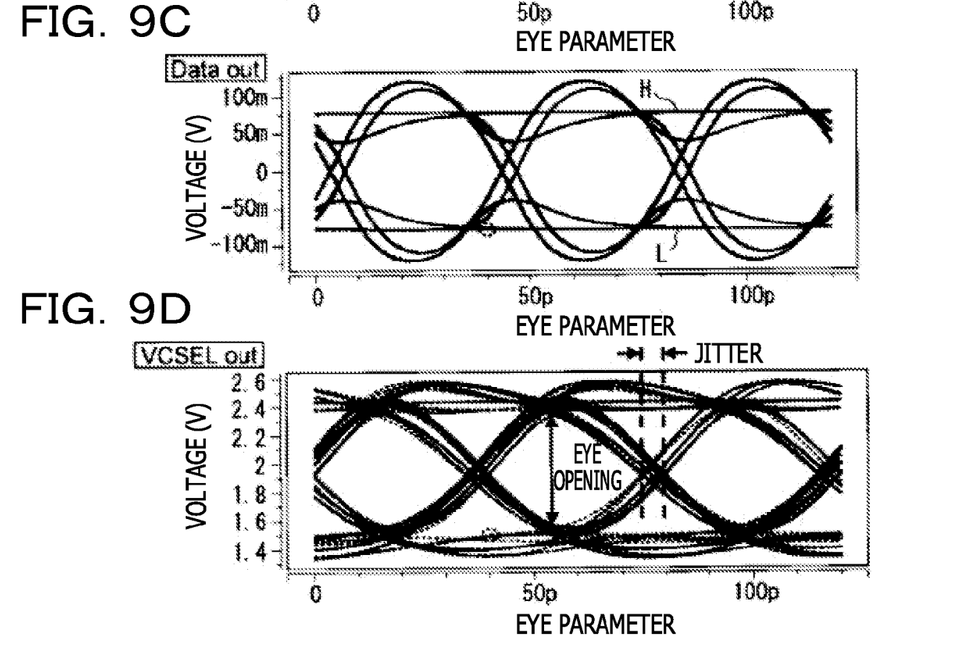

FIGS. 9A to 9D illustrate an example of effects obtained by pre-emphasis. In FIGS. 9C and 9D, effects obtained by the pre-emphasis using the emphasis signal generated by the emphasis signal generating circuit of FIG. 4 are illustrated. FIGS. 9A and 9B illustrate the effect obtained by the pre-emphasis using the emphasis signal from the emphasis signal generating circuit of FIG. 1. FIG. 9A illustrates the Data out with the pre-emphasis by using the emphasis signal from the emphasis signal generating circuit of FIG. 1. FIG. 9B illustrates the VCSEL out with the pre-emphasis in the case of FIG. 9A. FIGS. 9A and 9B may correspond to FIGS. 3C and 3D. FIG. 9C illustrates the Data out with the pre-emphasis by using the emphasis signal from the emphasis signal generating circuit of FIG. 4. FIG. 9D illustrates the VCSEL out with the pre-emphasis in the case of FIG. 9C. In FIGS. 9A to 9D, the abscissa denotes the time using an eye parameter with a data cycle being 40 p.

Comparison of FIGS. 9A and 9B with FIGS. 9C and 9D reveals that the eye opening of the VCSEL out is wider and the jitter is smaller in FIG. 4 than those in the case using the emphasis signal from the emphasis signal generating circuit of FIG. 1.

In the emphasis signal generating circuit of FIG. 4, only the high-frequency component is extracted by the coupling capacitor without increasing the number of branches (the number of taps) to separately be added/subtracted, so that influences by non-linear components in the taps may be reduced whereby an emphasis signal may efficiently be generated. The high-frequency component, for example, only the high-frequency component is separately added/subtracted, and thus addition/subtraction in reverse phase of the branched signal is performed in order to perform phase compensation for the high-frequency component because this high-frequency component includes the delay controlled signals. Accordingly, even in the same number of branches (the same number of taps), the improvement of the phase characteristics by the group delay compensation may be achieved simultaneously while the high-frequency region may strongly be emphasized because the group delay of this high-frequency component is affected by transmitting the coupling capacitor. Accordingly, the generation of the emphasis signal as well as the phase compensation is simultaneously performed, so that an eye waveform (eye pattern) with favorable strength characteristics and phase characteristics may be achieved.

Figure 10:
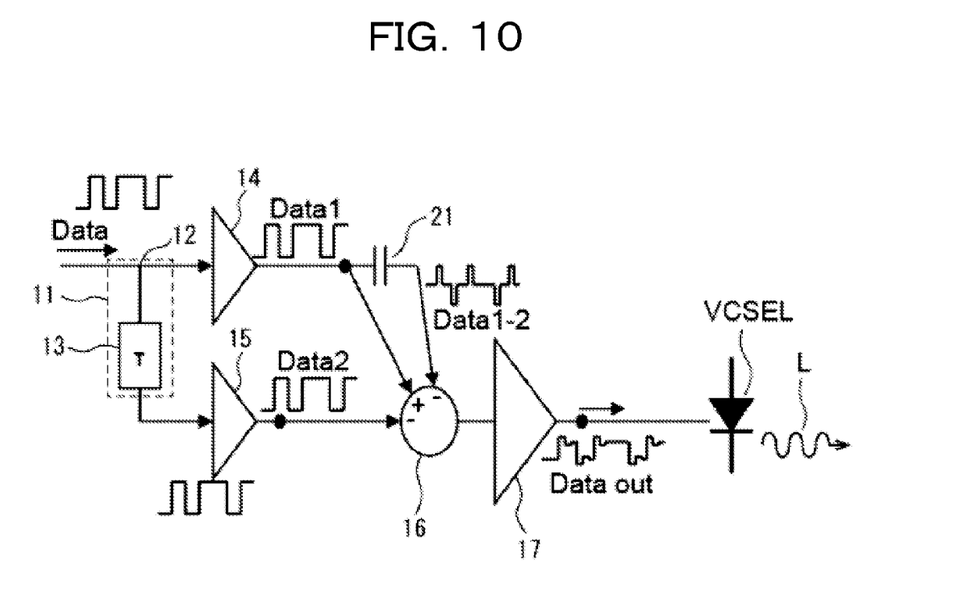
FIG. 10 illustrates an example of an emphasis signal generating circuit.

FIG. 10 illustrates an example of an emphasis signal generating circuit. In the emphasis signal generating circuit in FIG. 4, the high-frequency component of the branched signal Data 2 that is branched and delayed is added to the addition and subtraction unit 16. In the emphasis signal generating circuit in FIG. 10, the high-frequency component of the main data signal Data 1 is extracted by a coupling capacitor unit 21 to be input to the addition and subtraction unit 16. Other configurations and functions illustrated in FIG. 10 may be substantially the same or similar to those illustrated in FIG. 4. In the configuration of FIG. 10, although the high-frequency component of the main data signal Data 1 is subtracted upon generation of the emphasis signal in the addition and subtraction unit 16, addition may be performed so as to obtain a desired characteristic because this high-frequency component includes the delay controlled signals. Accordingly, even in the same number of branches (the same number of taps), the improvement of the phase characteristics by the group delay compensation may be achieved simultaneously while the high-frequency region may strongly be emphasized because the group delay of this high-frequency component is affected by transmitting the coupling capacitor.

Figure 11:
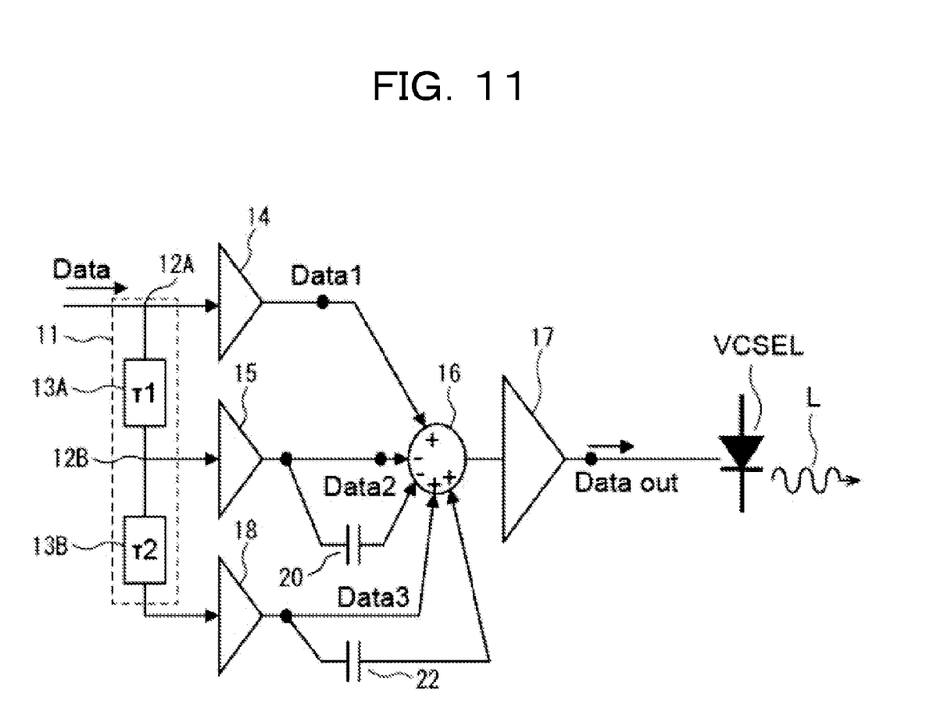
FIG. 11 illustrates an example of an emphasis signal generating circuit.

FIG. 11 illustrates an example of an emphasis signal generating circuit. In FIGS. 4 and 10, the number of taps may be reduced. The configuration, in which the high-frequency component is extracted by the coupling capacitor to be subjected to addition/subtraction for generation of the emphasis signal, may be applied to a configuration in which the number of taps is increased.

The emphasis signal generating circuit in FIG. 11 is different from that in FIG. 4 in that the branch and delay unit 11 has a second branch unit 12B and a second delay unit 13B in addition to the first branch unit 12A and the first delay unit 13A, and the emphasis signal generating circuit has an amplifier 18 and a coupling capacitor unit 22. The second branch unit 12B branches a second branched data signal Data 3 from a first branched data signal Data 1 that is delayed. The second delay unit 13B delays the branched second branched data signal Data 3. The amplifier 18 amplifies the delayed second branched data signal Data 3 to send the second branched data signal Data 3 to the addition and subtraction unit 16. The coupling capacitor 22 extracts a high-frequency component from the second branched data signal Data 3 that is amplified by the amplifier 18 to send the high-frequency component to the addition and subtraction unit 16. The addition and subtraction unit 16 subtracts the Data 2 and a high-frequency component of the Data 2 from the Data 1, adds the Data 3 and the high-frequency component of the Data 3 to generate an emphasis signal Data out.

In FIG. 11, although the Data 2 and the high-frequency component of the Data 2 are subtracted from the Data 1 and the Data 3 and the high-frequency component of the Data 3 are added, the embodiment is not limited to this, and the addition, subtraction, and weighting on the signals may appropriately be performed.

Figure 12:
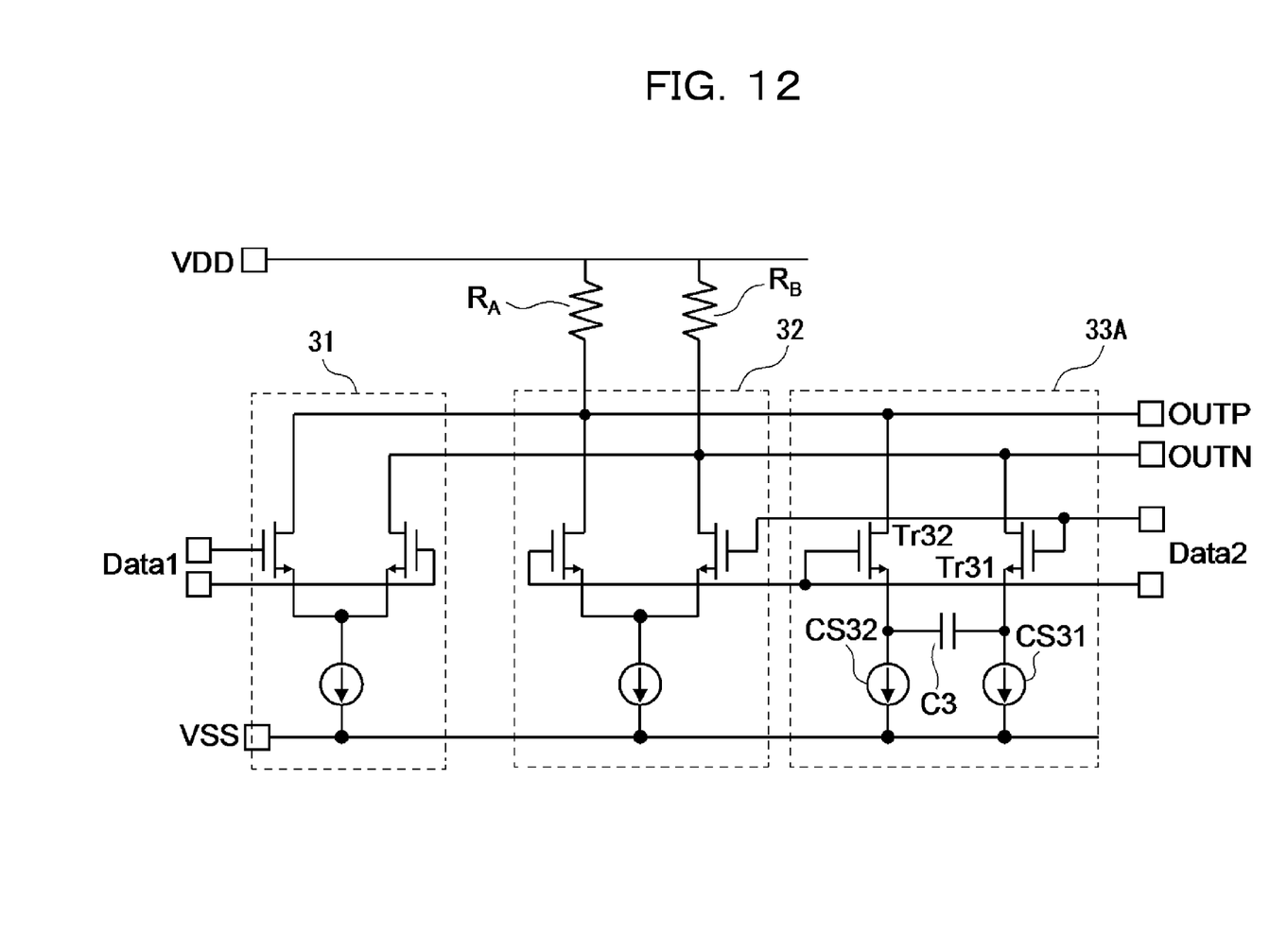
FIG. 12 illustrates an example of an addition and subtraction unit and a coupling capacitor unit.

FIG. 12 illustrates an example of an addition and subtraction unit and a coupling capacitor unit. In FIG. 12, the addition and subtraction unit 16 and the coupling capacitor unit 20 of the emphasis signal generating circuit are illustrated. A current circuit 33A in the addition and subtraction unit 16 and coupling capacitor 20 illustrated in FIG. 12 is different from the current circuit 33 illustrated in FIG. 5. Other configurations may be substantially the same or similar to those illustrated in FIG. 5.

The current circuit 33A includes two constant current sources CS31 and CS32 in place of the constant current source CS3 and a capacitor C3 in place of the capacitors C1 and C2. The constant current source CS31 is coupled to the source of the Tr31 and the constant current source CS32 is coupled to the source of the Tr32. The capacitor C3 is coupled between the source of the Tr31 and the source of the Tr32.

The addition and subtraction unit 16 and the coupling capacitor unit 20 illustrated in FIG. 12 may exhibit substantially the same or similar effects obtained by the configuration illustrated in FIG. 5. In FIG. 5, the high-frequency component is separated at a preceding stage of the transistor of an amplifier circuit, and therefore, the influence of the non-linearity such as limiter characteristics of the transistors Tr31 and Tr32 is found. In FIG. 12, a limiter is applied to the high-frequency component, for example, only to the high-frequency component using the limiter characteristics of a differential amplifier circuit before addition and subtraction are performed. Hence, reduction of the high-frequency component due to the non-linearity of the amplifier circuit 33 is decreased, and the emphasis signal may be generated efficiently for adding or subtracting this high-frequency component including the delay controlled signals.

As an example, a delay amount T of the branched signal as well as processing of addition, subtraction, and weighting of the signals in the addition and subtraction unit may appropriately be determined for a desirable emphasis signal suitable for characteristics of a communication path. Elements of the circuits such as the addition and subtraction unit are not particularly limited so long as a desired function is implemented.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An emphasis signal generating circuit comprising:
   a branch and delay unit configured to branch an input signal into a first input signal and a second input signal, delay the second input signal, and output the first input signal and a first delayed signal;
   a high-frequency extraction unit configured to extract at least one of high-frequency components of the first input signal and the first delayed signal by using a high-pass filter function to output a high-frequency signal; and
   an addition and subtraction unit configured to add or subtract the first input signal, the first delayed signal, and the high-frequency signal based on a connection mode between an input part which receives the first input signal, the first delayed signal, and the high-frequency signal, and a load part.

2. The emphasis signal generating circuit according to claim 1, wherein
   the branch and delay unit outputs a plurality of second delayed signals with different amounts of delay as the first delayed signal, and
   the high-frequency extraction unit extracts at least one of the high-frequency components of the first input signal and the plurality of second delayed signals to output the high-frequency signal.

3. The emphasis signal generating circuit according to claim 1, wherein
   a load in the load part is serially coupled between a high-potential source and a low-potential source, and
   the input part receives the first input signal, the first delayed signal, and the high-frequency signal.

4. The emphasis signal generating circuit according to claim 3, wherein
   the input part includes a plurality of current circuits coupled in parallel and configured to produce currents corresponding to an input.

5. The emphasis signal generating circuit according to claim 1, wherein
   the high-frequency extraction unit includes a coupling capacitor which performs the high-pass filter function.

6. The emphasis signal generating circuit according to claim 4, wherein
   the first input signal is a differential signal,
   the plurality of current circuits of the addition and subtraction unit are each provided for a differential pair, and
   the high-frequency extraction unit includes a coupling capacitor that is coupled between two signal communication paths forming the differential pair that receives the high-frequency signal as an input.

7. The emphasis signal generating circuit according to claim 6, wherein
   the differential pair includes transistors and receives the first input signal, the first delayed signal, or the high-frequency signal at control ends of the transistors.

8. A method for generating an emphasis signal comprising:
   branching an input signal into a first input signal and a second input signal;
   delaying the second input signal to output a first delayed signal;
   extracting at least one of high-frequency components of the input signal and the first delayed signal by using a coupling capacitor to output a high-frequency signal; and
   adding or subtracting the first input signal, the first delayed signal, and the high-frequency signal based on a connection mode between an input part which receives the first input signal, the first delayed signal, and the high-frequency signal, and a load part.

9. The method according to claim 8, wherein
   the first delay signal includes a plurality of second delayed signals with different amounts of delay, and
   at least one of the high-frequency components of the first input signal and the plurality of second delayed signals is extracted as the high-frequency signal.

10. The method according to claim 8, wherein
    the first input signal is a differential signal, and
    the coupling capacitor is coupled between two signal communication paths forming a differential pair that receives the high-frequency signal as an input.

11. The method according to claim 8, wherein
    the first input signal is a differential signal, and
    the coupling capacitor is coupled to sources of transistors of a differential pair that receives the high-frequency signal as an input.

12. The emphasis signal generating circuit according to claim 1, wherein the input part includes differential pairs that receive the first input signal, the first delayed signal, and the high-frequency signal, respectively, the load part includes a plurality of loads, and the addition and subtraction unit is configured to add or subtract based on a connection between each of the differential pairs and the plurality of loads.

13. The method according to claim 8, wherein the input part includes differential pairs that receive the first input signal, the first delayed signal, and the high-frequency signal, respectively, the load part includes a plurality of loads, and the addition and subtraction unit configured to add or subtract based on a connection between each of the differential pairs and the plurality of loads.

* * * * *